(12) United States Patent
Lavitsky et al.

(10) Patent No.: US 9,564,348 B2
(45) Date of Patent: Feb. 7, 2017

(54) SHUTTER BLADE AND ROBOT BLADE WITH CTE COMPENSATION

(71) Applicant: Applied Materials, Inc., Santa Clara, CA (US)

(72) Inventors: Ilya Lavitsky, San Francisco, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 372 days.

(21) Appl. No.: 14/217,137

(22) Filed: Mar. 17, 2014

(65) Prior Publication Data

US 2014/0271081 A1 Sep. 18, 2014

Related U.S. Application Data

(60) Provisional application No. 61/793,725, filed on Mar. 15, 2013.

(51) Int. Cl.
*B23F 15/04* (2006.01)
*H01L 21/67* (2006.01)
*H01L 21/677* (2006.01)

(52) U.S. Cl.
CPC ... *H01L 21/67103* (2013.01); *H01L 21/67259* (2013.01); *H01L 21/67742* (2013.01); *H01L 21/67748* (2013.01)

(58) Field of Classification Search
CPC ............. B23Q 1/03; B23Q 1/25; C23C 14/00; C23C 14/04; C23C 16/45561; B25B 11/00; B25B 11/02
See application file for complete search history.

(56) References Cited

U.S. PATENT DOCUMENTS

| | | | |
|---|---|---|---|
| 6,669,829 B2 | 12/2003 | Feltsman et al. | |
| 6,827,825 B2 | 12/2004 | Feltsman et al. | |
| 7,008,517 B2 | 3/2006 | Feltsman | |
| 2003/0155234 A1 | 8/2003 | Feltsman et al. | |
| 2004/0089536 A1 | 5/2004 | Feltsman et al. | |
| 2004/0182698 A1 | 9/2004 | Feltsman | |
| 2010/0071625 A1* | 3/2010 | Brown | C23C 14/564 118/729 |
| 2010/0089315 A1 | 4/2010 | Brown et al. | |
| 2012/0103793 A1* | 5/2012 | Fujii | H01J 37/3447 204/192.1 |

(Continued)

*Primary Examiner* — Lee D Wilson
(74) *Attorney, Agent, or Firm* — Patteson & Sheridan, LLP

(57) ABSTRACT

Processing chamber shutter blade and robot blade assemblies are constructed to eliminate thermal effects on the placement of elements in processing chambers. Such blade assemblies may contain at least two parts, which may include a positioning member including a low CTE material and a thermal compensating member including a high CTE material. The positioning member includes a coupling point and a reference point on a reference axis separated by a first distance. The thermal compensating member includes a connection point and a controlled point separated by another distance that is less than the first distance. A distance ratio of the first distance to the other distance is substantially equal to a CTE ratio of the high CTE material to the low CTE material, and the positioning member is joined to the thermal compensating member through the coupling point and the connection point.

20 Claims, 12 Drawing Sheets

(56) References Cited

U.S. PATENT DOCUMENTS

| | | | |
|---|---|---|---|
| 2012/0175819 A1* | 7/2012 | Miya | H01L 21/02052 264/334 |
| 2014/0020629 A1 | 1/2014 | Tsai et al. | |
| 2014/0196848 A1 | 7/2014 | Chia et al. | |
| 2014/0209240 A1* | 7/2014 | Matsuzaki | H01L 21/67126 156/345.31 |
| 2014/0271081 A1* | 9/2014 | Lavitsky | H01L 21/67103 414/744.2 |
| 2014/0308028 A1* | 10/2014 | Mashimo | H01L 21/67109 392/416 |
| 2015/0075971 A1* | 3/2015 | Furukawa | H01J 37/3444 204/192.15 |
| 2015/0187546 A1* | 7/2015 | Furukawa | H01J 37/3405 204/192.22 |

* cited by examiner

SHUTTER BLADE AND ROBOT BLADE WITH CTE COMPENSATION

CROSS REFERENCE TO RELATED APPLICATIONS

This application claims benefit of U.S. provisional patent application Ser. No. 61/793,725, filed Mar. 15, 2013, which is herein incorporated by reference.

BACKGROUND OF THE INVENTION

Field of the Invention

Embodiments of the invention generally relate to substrate processing chamber assemblies and physical vapor deposition chamber assemblies in particular.

Description of the Related Art

Many semiconductor processes are typically performed in a vacuum environment. For example, physical vapor deposition (PVD) is generally performed in a sealed chamber having a pedestal for supporting a substrate disposed thereon. The pedestal typically includes a substrate support that has electrodes disposed therein to electrostatically hold the substrate against the substrate support during processing. A target generally comprised of a material to be deposited on the substrate is supported above the substrate, typically fastened to a top of the chamber. A plasma formed from a gas, such as argon, is supplied between the substrate and the target. The target is biased, causing ions within the plasma to be accelerated toward the target. Ions impacting the target cause material to become dislodged from the target. The dislodged material is attracted toward a substrate and deposits a film of material thereon.

Generally, two conditioning operations are performed in the PVD chamber to ensure process performance. A first conditioning process is known as burning-in the target. Target burn-in generally removes oxides and other contaminants from the surface of the target and is typically performed after the chamber has been exposed to atmosphere or idled for a period of time. During the burn-in process, a utility wafer or shutter disk is disposed on the substrate support to prevent deposition of target material on the support. The burn-in process generally comprises forming a plasma within the chamber and using that plasma to remove the surface layer of material from the target.

A second conditioning process is known as pasting. Pasting generally applies a covering over material deposited on chamber components during a conventional PVD process. For example, PVD application of titanium nitride generally results in a layer of titanium nitride on the PVD chamber surfaces. The titanium nitride layer is typically brittle and may flake off during subsequent processes. Pasting generally applies a layer of titanium over the titanium nitride layer. The titanium layer substantially prevents the underlying titanium nitride from flaking or peeling. Typically, the chamber is pasted at predetermined intervals, such as after every 25 substrates are processed using a conventional titanium nitride PVD process. As with target burn-in, a shutter disk is disposed on the substrate support to prevent deposition of target material thereon during the pasting process.

Additionally, in PVD processes where titanium and titanium nitride are sequentially applied in-situ, the target requires cleaning prior to each titanium deposition to remove nitrides that may be present on the target from titanium nitride deposited on the prior substrate. Generally, target cleaning is similar to a burn-in process, having a few seconds duration, and includes protecting the substrate support with a shutter disk.

After completion of each burn-in, pasting and cleaning process, the shutter disk is rotated by a robotic arm disposed within the PVD chamber to a cleared position where the shutter disk does not interfere with the deposition process within the chamber. The position of the shutter disk is determined by various sensors in the shaft drive coupled to the robotic arm and in and on the chamber to detect the rotational position of the arm.

The shutter disk is placed on a heater puck in the processing chamber by rotating a shutter blade (robotic arm). An initial disk set up is done at room temperature. However, the temperature of the blade varies as different process steps are performed and, as a result, the position of the shutter disk is shifted due to the effects of uncoordinated lifting and lowering of the shutter disk on the robot arm with respect to the temperature change. The position of the shutter blade may vary because of the expansion (and contraction) of the blade. Even when using a low CTE (coefficient of thermal expansion) blade material, the variation in shutter disk radial displacement can be significant so as to expose the heater which the shutter disk is intended to protect to unplanned deposition and damage which may require additional positioning cycles to correct and/or repair, each of which reduces the usable life of the heater.

A misalignment between the shutter disk and the robotic arm may result in a portion of the shutter disk remaining in the path of the ceramic substrate support (heater). As the ceramic support is elevated into a process position, a portion of the substrate may contact the shutter disk, which may result in damage to the substrate or misalignment of the substrate on the ceramic support. Moreover, if the shutter disk comes in contact with the ceramic support, the ceramic support may become chipped or damaged and necessitate replacement. Additionally, if the shutter disk is not properly aligned on the robotic arm, the disk may be misaligned relative to the ceramic support (heater) during the burn-in and pasting process, thereby resulting in unwanted deposition on a portion of the ceramic support. Deposition material on the ceramic support may lead to particle generation, scratching of the wafer and a deterioration of process performance.

Similarly, a robot blade delivering substrates, which under current generations are of increasing large size, require consideration of additional positioning variables, related to temperature when robotically lifting and lowering substrates to and from high and low temperature environments based on the expected relative position of where the robot arm is programmed to expect the substrate to be and the actual location of the robot arm blade substrate center reference point. When temperature variations exist between pick up and drop off locations, the robot blade center reference point location varies due to the temperature changes.

Therefore, there is a need for improved shutter blade assemblies and robot blade assemblies in temperature elevated substrate processing chambers and their adjacent and associated support housing.

SUMMARY OF THE INVENTION

Embodiments of the present invention generally provide an apparatus for use in substrate processing chambers and in particular physical vapor deposition chambers and a method using the same. A processing chamber element positioning system is provided that includes an actuator, a positioning member having a first CTE and a thermal compensating member having a second CTE that is greater than the first CTE. The actuator located in the processing chamber extends along a reference axis from a fixed position in the processing chamber to a reference point. The positioning member is coupled to the actuator at an anchoring end. The positioning member includes a coupling point at a distal free end separated from the reference point by a first distance. The thermal compensating member includes a connection point coupled to the positioning member at the coupling point, and a controlled point separated from the reference axis by a second distance that is less than the first distance. The second distance defines an attachment distance between the reference axis and an attachment point for coupling an element to the thermal compensating member. The controlled point is separated from the connection point by a third distance. A distance ratio of the first distance to the third distance is substantially equal to a CTE ratio of the second CTE to the first CTE.

Embodiments of the present invention may further provide a processing chamber element positioning system that includes an actuator, a positioning member having a first CTE and a thermal compensating member having a second CTE that is greater than the first CTE. The actuator located in the processing chamber extends along a reference axis from a fixed position in the processing chamber. The positioning member has an anchoring end coupled to the actuator and includes a positioning body. The positioning body extends from the anchoring end to a distal free end, wherein the reference axis extends past the positioning member at the anchoring end. The positioning member further includes a coupling point separated from the reference axis by a first distance. The thermal compensating member includes a fixed end having a connection point coupled to the positioning member, wherein the connection point and the coupling point of the positioning member are located on a distal end line that is parallel with the reference axis. The thermal compensating member further includes a thermal compensating body extending from the connection point, towards the reference axis, to a movable end. The thermal compensating member further includes an attachment point proximate the movable end and separated from the reference axis by a second distance that is less than the first distance. A third distance is defined by a difference between the first distance and the second distance, and a distance ratio of the first distance to the third distance is substantially equal to a CTE ratio of the second CTE to the first CTE.

A processing chamber element positioning system is provided that includes a positioning member having a first CTE and a thermal compensating member having a second CTE. The positioning member includes an anchoring end coupled to a rotary actuator having a rotary axis; a distal free end; and a positioning body extending a first radial distance from the rotary axis to a coupling point. The thermal compensating member includes a fixed end secured to the positioning member at the coupling point; a thermal compensating body extending from the fixed en towards the rotary axis to a movable end; and an attachment point closer to the movable end than to the fixed end and separated from the rotary axis by a second radial distance. A difference between the first radial distance and the second radial distance defining a third radial distance that is less than the first radial distance, wherein a distance ratio of the first radial distance to the third radial distance is substantially equal to a CTE ratio of the second CTE to the first CTE.

Embodiments of the present invention may further provide a processing chamber element positioning system, comprising a positioning member comprising a positioning body that has a first CTE, wherein the positioning body further comprises an anchoring end that is configured to be coupled to an actuator, wherein a reference axis extends through the anchoring end, and a distal free end having a coupling point that is separated from the reference axis by a first distance, and a thermal compensating member comprising a thermal compensating body that has a second CTE greater than the first CTE, and the thermal compensating body comprises a connection point that is coupled to the positioning member body at the coupling point, and a controlled point separated from the reference axis by a second distance that is less than the first distance, the second distance defining an attachment distance between the reference axis and an attachment point for coupling an element to the thermal compensating member, wherein a third distance is equal to the first distance minus the second distance, and a distance ratio of the first distance to the third distance is substantially equal to a CTE ratio of the second CTE to the first CTE. In general, the actuator is coupled to a portion of the processing chamber, such as a wall or other mounting surface.

Embodiments of the present invention may further provide a processing chamber element positioning system, comprising an actuator coupled to a portion of a processing chamber, a positioning member comprising a positioning body that has a first CTE, wherein the positioning body further comprises an anchoring end that is coupled to the actuator, wherein a reference axis extends through the anchoring end and the actuator, and a distal free end having a coupling point that is separated from the reference axis by a first distance, and a thermal compensating member comprising a thermal compensating body that has a second CTE greater than the first CTE, and the thermal compensating body comprises a connection point that is coupled to the positioning member body at the coupling point, wherein the thermal compensating body extends from the connection point, towards the reference axis, to a movable end; and an attachment point separated from the reference axis by a second distance that is less than the first distance, wherein a third distance is defined by a difference between the first distance and the second distance, and a distance ratio of the first distance to the third distance is substantially equal to a CTE ratio of the second CTE to the first CTE.

Embodiments of the present invention may further provide a processing chamber element positioning system, comprising a positioning member comprising a positioning body that has a first CTE, wherein the positioning body further comprises a distal free end, and an anchoring end that is coupled to a rotary actuator, which has a rotary axis extending through the rotary actuator, wherein the positioning body extends a first radial distance from the rotary axis to a coupling point, and a thermal compensating member comprising a thermal compensating body that has a second CTE greater than the first CTE, and the thermal compensating body comprises a fixed end that is coupled to the positioning member at the coupling point, and a movable end having an attachment point that is positioned closer to the movable end than to the fixed end and is separated from the rotary axis by a second radial distance, which is less than the first radial distance, wherein a third distance is defined by a difference between the first distance and the second distance, and a distance ratio of the first distance to the third distance is substantially equal to a CTE ratio of the second CTE to the first CTE.

BRIEF DESCRIPTION OF THE DRAWINGS

The appended drawings illustrate only typical embodiments and are therefore not to be considered limiting in scope and may admit to other equally effective embodiments.

To facilitate understanding, identical reference numerals have been used, wherever possible, to designate identical elements that are common to the figures.

DETAILED DESCRIPTION

Embodiments of the disclosure generally provide one or more deposition conditioning assemblies that are adapted to prevent deposition of a material on critical components within a processing chamber during one or more conditioning operations, such as a burn-in or pasting processes. In some configurations, the deposition conditioning assemblies may include a utility wafer that is used to protect the critical components found within the processing chamber. In some embodiments, a semiconductor processing system having a sensor assembly adapted to detect a cleared position of the utility wafer, such as a shutter disk is generally described herein. The "cleared position" is generally defined as a position where a substrate support (and substrate seated thereon) may move vertically without contacting the shutter disk or mechanisms associated with the movement of the shutter disk. Although the embodiments are described in a physical vapor deposition chamber, the disclosure is one of illustration, and accordingly, utility may be found in other semiconductor processing chambers where it is advantageous to confirm a cleared position of a utility wafer or other device which may be disposed over a substrate support between substrate processing operations.

Figure 1:
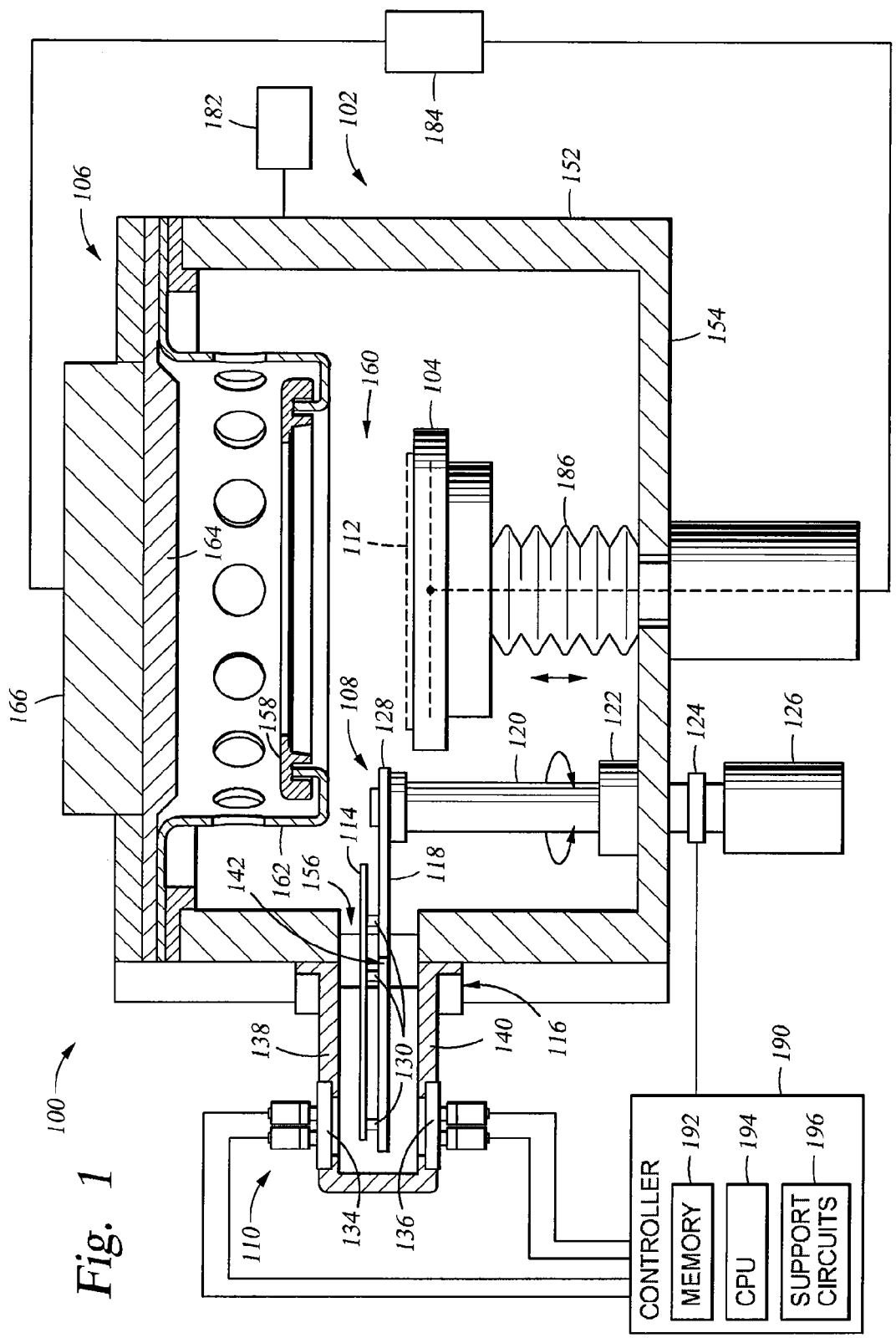
FIG. 1 depicts a semiconductor processing chamber having one embodiment of a sensor assembly adapted to detect a position of a shutter disk mechanism.

FIG. 1 depicts a process chamber 100 for processing semiconductors, and includes a sensor assembly 110 that is adapted to detect a cleared position of a utility wafer or shutter disk 114. Generally, the sensor assembly 110 is utilized to ensure that the shutter disk 114 is not in a position that would contact a substrate support 104 or a substrate 112 seated thereon during processing.

The exemplary process chamber 100 includes a chamber body 102 and lid assembly 106 that define an evacuable process volume 160. The chamber body 102 is typically fabricated from a unitary block of aluminum or welded stainless steel plates. The chamber body 102 generally includes sidewalls 152 and a bottom 154. The sidewalls generally contain a plurality of apertures that include an access port, pumping port and a shutter disk port 156 (access and pumping ports not shown). The sealable access port provides for entrance and egress of the substrate 112 from the process chamber 100. The pumping port is coupled to a pumping system (not shown) that evacuates and controls the pressure within the process volume 160. The shutter disk port 156 is configured to allow at least a portion of the shutter disk 114 therethrough when the shutter disk 114 is in the cleared position. A housing 116 generally covers the shutter disk port 156 to maintain the integrity of the vacuum within the process volume 160.

The lid assembly 106 of the chamber body 102 generally supports an annular shield 162 suspended therefrom that supports a shadow ring 158. The shadow ring 158 is generally configured to confine deposition to a portion of the substrate 112 exposed through the center of the shadow ring 158.

The lid assembly 106 generally includes a target 164 and a magnetron 166. The target 164 provides material to be deposited on the substrate 112 during the PVD process, while the magnetron 166 enhances uniform consumption of the target material during processing. The target 164 and substrate support 104 are biased relative to each other by a power source 184. A gas such as argon is supplied to the process volume 160 from a gas source 182. A plasma is formed between the substrate 112 and the target 164 from the gas. Ions within the plasma are accelerated toward the target 164 and cause material to become dislodged from the target 164. The dislodged target material is attracted towards the substrate 112 and deposits a film of material thereon.

The substrate support 104 is generally disposed on the bottom 154 of the chamber body 102 and supports the substrate 112 during processing. The substrate support 104 is coupled to the bottom 154 by a lift mechanism (not shown) that is configured to move the substrate support 104 between a lower (as shown) and an upper position. The substrate support 104 is moved into the upper position for processing. In the upper position, the substrate 112 is disposed on the substrate support 104 and engages the shadow ring 158, lifting the shadow ring 158 from the annular shield 162.

In the lower position, the substrate support 104 is positioned below the annular shield 162 to allow the substrate 112 to be removed from the process chamber 100 through the port in the sidewall 152 while clearing the shadow ring 158 and annular shield 162. Lift pins (not shown) are selectively moved through the substrate support 104 to space the substrate 112 from the substrate support 104 to facilitate securing of the substrate 112 by a wafer transfer mechanism disposed exterior to the process chamber 100 such as a single blade robot (not shown). A bellows 186 is typically disposed between the substrate support 104 and the chamber bottom 154 and provides a flexible seal therebetween, thereby maintaining vacuum integrity of the process volume 160.

The substrate support 104 is typically fabricated from aluminum, stainless steel, ceramic or combinations thereof. One substrate support 104 that may be adapted is described in U.S. Pat. No. 5,507,499, issued Apr. 16, 1996 to Davenport et al., which is incorporated herein by reference in its entirety.

A shutter disk mechanism 108 is generally disposed proximate the substrate support 104. The shutter disk mechanism 108 generally includes a blade 118 that supports the shutter disk 114 and an actuator 126 coupled to the blade 118 by a shaft 120. A rotary seal 122 is disposed through the chamber bottom 154 to allow rotation of the shaft 120 without vacuum leakage from the process volume 160.

The actuator 126 generally controls the angular orientation of the blade 118. Typically, the blade 118 is moved between the cleared position shown in FIG. 1 and a second position that places the shutter disk 114 substantially concentric with the substrate support 104. In the second position, the shutter disk 114 may be transferred (by utilizing the lift pins) to the substrate support 104 during the target burn-in and chamber pasting process. Typically, the blade 118 is returned to the cleared position during the target burn-in and chamber pasting process.

The actuator 126 may be any device that may be adapted to rotate the shaft 120 through an angle that moves the blade 118 between the cleared and second positions. The actuator 126 may be an electric, hydraulic or air motor, a pneumatic or hydraulic cylinder, or a solenoid, among other motion devices. The actuator 126 may include a shaft sensor 124 that detects when the shaft 120 is rotated to the second position. The shaft sensor 124 may be directly coupled to the actuator 126, as with a rotary encoder or limit switch, or may interface with the shaft 120, as with a limit switch. Other sensors 124 that may be adapted to detect the angular position of the shaft 120 may also be utilized.

The blade 118 generally supports the shutter disk 114 in a horizontal orientation. The blade 118 typically has a flat body 142 that includes a hub 128 that is coupled to the shaft 120, and at least three disk support pins 130 extending therefrom. The disk support pins 130 generally support the shutter disk 114 in a spaced-apart relation to the blade 118. The blade 118 is configured to allow rotation of the blade 118 from the second position to the cleared position. The blade 118 additionally includes a tab 220 (shown in FIG. 2A) that extends beyond the perimeter of the shutter disk 114.

A portion of the shutter disk 114 is disposed in the housing 116 when in the cleared position. The housing 116 is typically fabricated from the same material as the chamber body 102. The housing 116 is sealingly fastened to the chamber body 102, and in one embodiment, is continuously welded at the interface between the housing 116 and chamber body 102 to ensure a vacuum-tight joint.

The housing 116 generally includes at least a first window 134 sealingly disposed through the housing 116. The first window 134 is positioned to allow the sensor assembly 110 to detect the presence of the shutter disk 114 and/or the blade 118 within the housing 116. In the embodiment depicted in FIG. 1, the housing 116 additionally includes a second window 136 formed in a bottom section 140 of the housing 116 opposite the first window 134 that is formed in a top section 138 of the housing 116. The windows 134, 136 are fabricated from a material substantially transparent or non-invasive to the detection mechanism of the sensor assembly 110, for example, quartz.

The sensor assembly 110 is generally disposed proximate the housing 116. The sensor assembly 110 generally includes at least one sensor that is adapted to detect the presence of the blade 118 and/or shutter disk 114 within the housing 116, preferably when in the cleared position.

The sensor assembly 110 is coupled to a controller 190 that interfaces with and typically controls the process chamber 100. The controller 190 typically comprises a central processing unit (CPU) 194, support circuits 196 and memory 192. The CPU 194 may be one of any form of computer processor that can be used in an industrial setting for controlling various chambers and sub-processors. The memory 192 is coupled to the CPU 194. The memory 192, or computer-readable medium, may be one or more of readily available memory such as random access memory (RAM), read only memory (ROM), floppy disk, hard disk, or any other form of digital storage, local or remote. The support circuits 196 are coupled to the CPU 194 for supporting the processor in a conventional manner. These circuits include cache, power supplies, clock circuits, input/output circuitry, subsystems, and the like. The sensors, at least including one of the sensor assembly 110 and the shaft sensor 124, provide information to the controller 190 regarding the position of the shutter disk 114 and/or the blade 118.

Figure 2A:
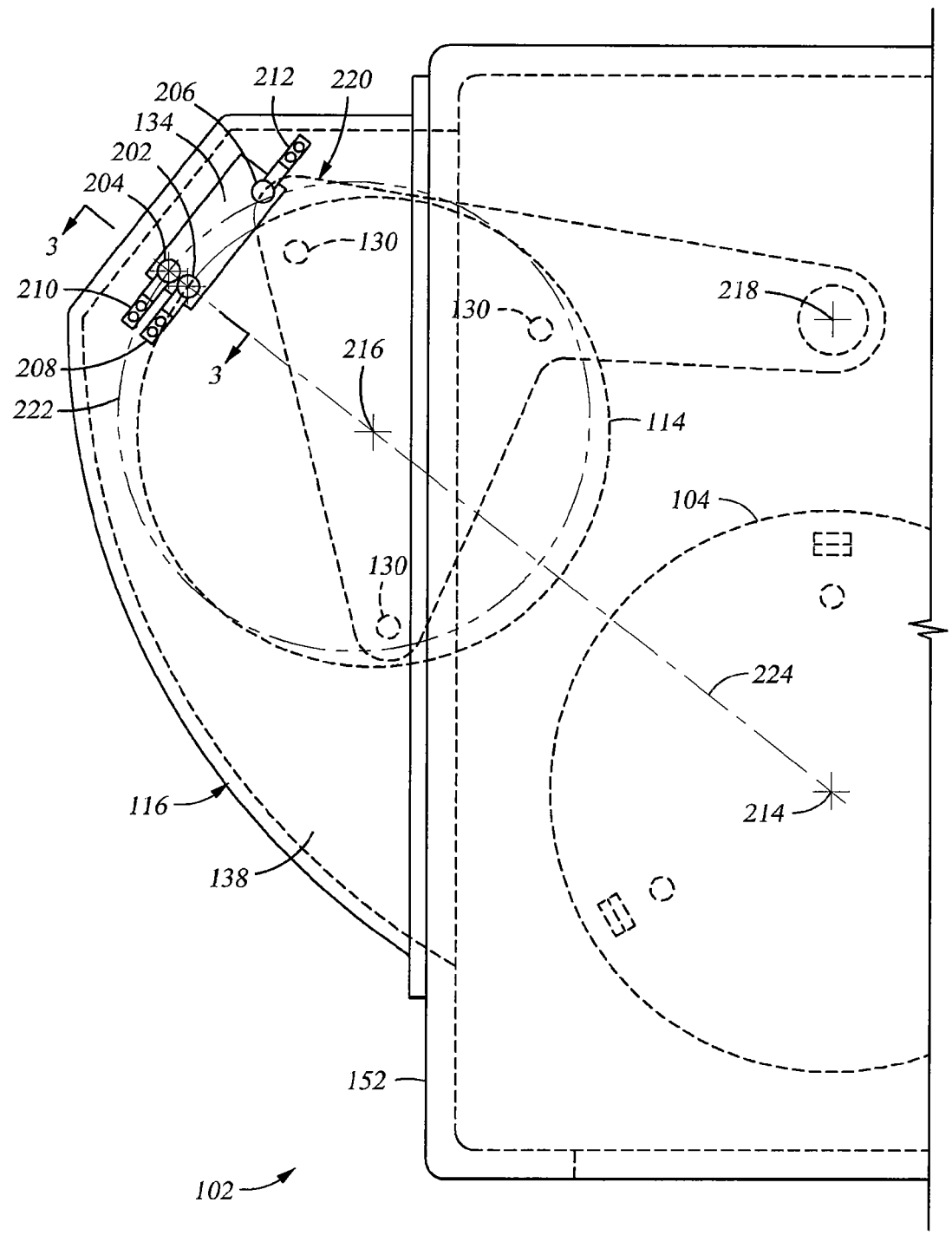
FIGS. 2A-B are sectional and plan views of a portion of the process chamber illustrated in FIG. 1, according to one or more embodiments of the invention.
Figure 2B:
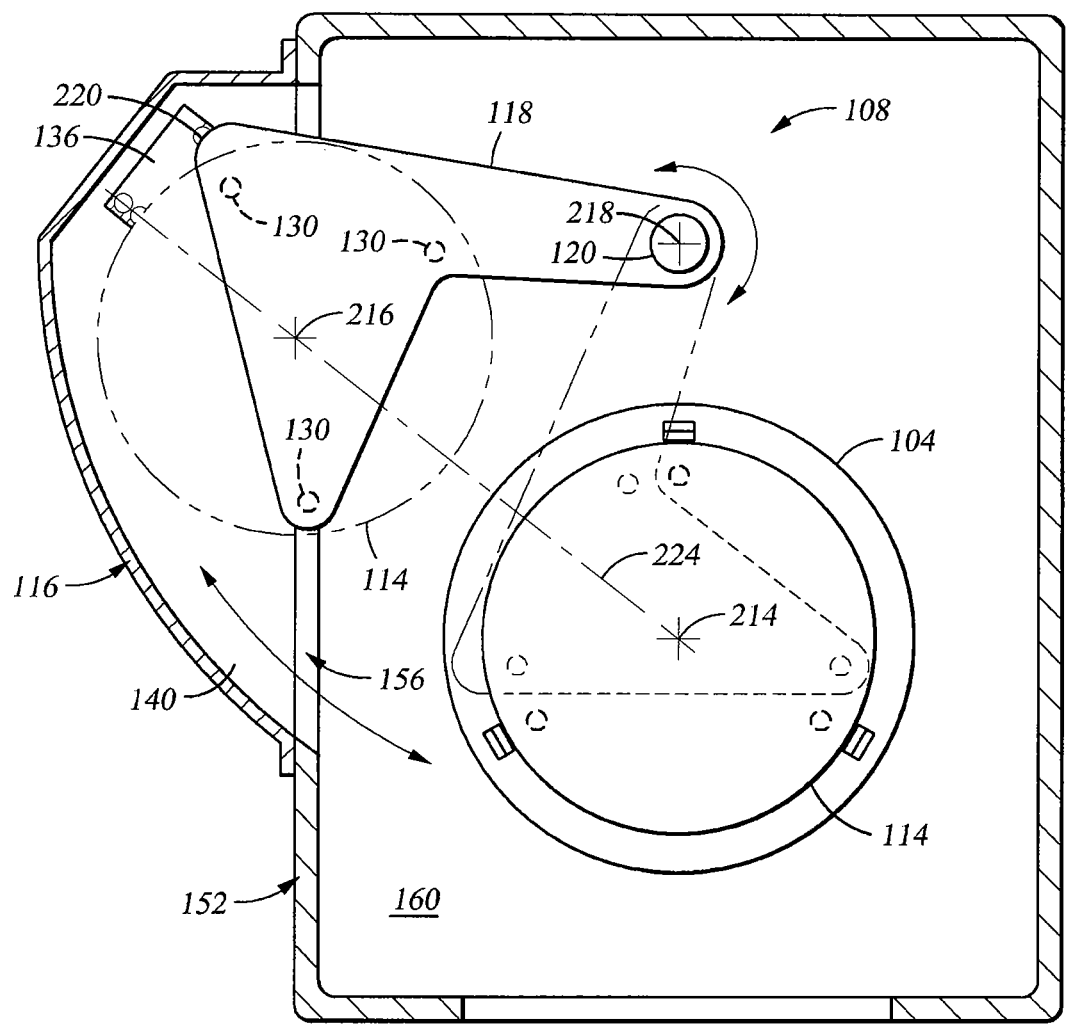

FIGS. 2A-B depict top and sectional plan views of the housing 116 illustrating one embodiment of the sensor assembly's position relative to the shutter disk 114, the blade 118 and the substrate support 104.

In the embodiment depicted in FIGS. 2A-B, the sensor assembly includes a first sensor 202, a second sensor 204 and a third sensor 206. The sensors 202, 204 and 206 are respectfully coupled to the first window 134 of the housing 116 by brackets 208, 210 and 212. The sensors 202, 204 and 206 generally provide a signal indicative of the presence of the shutter disk 114 and/or blade 118 thereunder.

The first and second sensors 202, 204 typically are positioned on a line 224 defined between a center point 214 of the substrate support 104 and reference point 216. The reference point 216 is generally located at the center of the shutter disk 114 when the shutter disk 114 is in the clear position (as shown). In one embodiment, the center and reference points 214, 216 are also equidistant from a central axis 218 of the shaft 120. The position of the sensors 202, 204 along the line 224 allows the sensors to provide a reliable indication that the shutter disk 114 is clear of the substrate support 104 as the line 224 lies along the shortest distance between the shutter disk 114 (when positioned correctly on the blade 118) and the substrate support 104.

The first sensor 202 generally detects the position of the shutter disk 114 when in the cleared position. The second sensor generally detects the shutter disk when the disk is mis-positioned on the blade 118 but still detected by the first sensor 202 as shown by phantom shutter disk 222. For example, the shutter disk 222 may be positioned off-centered on the blade 118, which places the disk 222 further into the housing 116. Although the off-center position of the shutter disk 222 will still enable the substrate support to be moved vertically without contacting the shutter disk 222, the shutter disk 222 will be misaligned with the substrate support 104 when rotated to the second position for pasting or target burn-in, which will allow material to be disadvantageously deposited on the substrate support 104. Thus, the second sensor 204 indicates shutter disk 114 misalignment to the controller 190 which signals the operator or stops the production sequence at an appropriate point for service.

The third sensor 206 is generally positioned to view a portion or tab 220 of the blade 118 to indicate that the blade 118 is in the cleared position. The tab 220 of the blade 118 may be covered by the shutter disk 114 or extend beyond the shutter disk 114 to allow detection of the blade 118 when the shutter disk 114 is also in the cleared position. Alternatively, the third sensor 206 may be positioned to view the substrate through the second window 136 or other window disposed in the housing 116.

Figure 3:
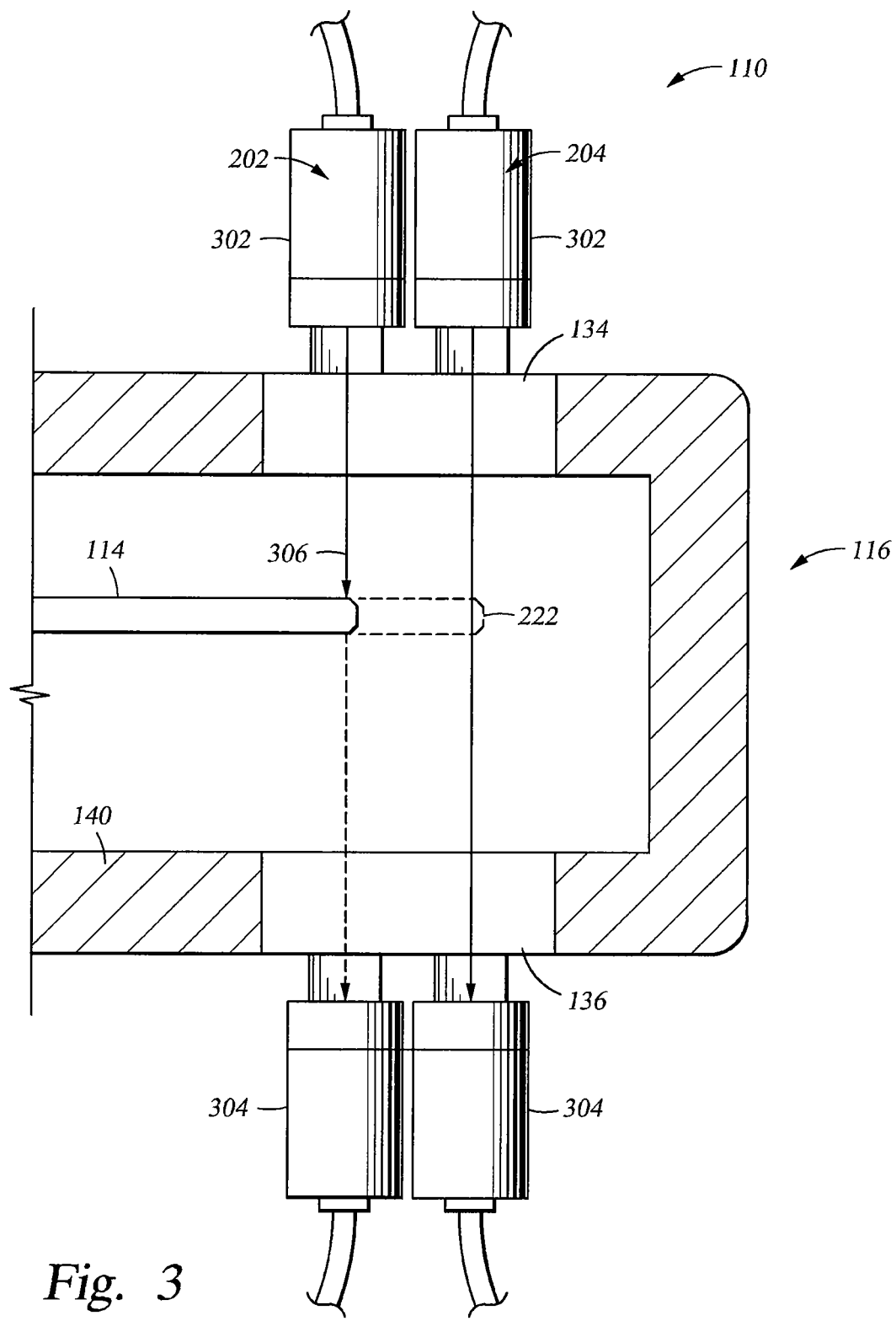
FIG. 3 depicts a sectional view of the sensor assembly taken along section line 3-3 illustrated in FIG. 2A, according to an embodiment of the invention.

FIG. 3 depicts a sectional view of one embodiment of the sensors 202, 204 taken along section line 3-3 in FIG. 2A. The sensors 202, 204 generally include an emitter 302 and a receiver 304. The emitter 302 generates a signal, such as a light beam 306, that passes through the windows 134, 136 and impinges upon the receiver 304. When the shutter disk 114 blocks or interrupts the light beam 306, the sensors 202, 204 change state to indicate the presence of the shutter disk 114. Examples of sensors 202, 204 that may be utilized to detect the shutter disk 114 are available from Banner Engineering Corporation, located in Minneapolis, Minn. Other types of sensors, including reflective sensors (i.e., a device having the emitter and receiver configured into a single unit), may alternatively be utilized. The third sensor 206 is similarly configured to detect the presence of the blade 118.

Figure 4:
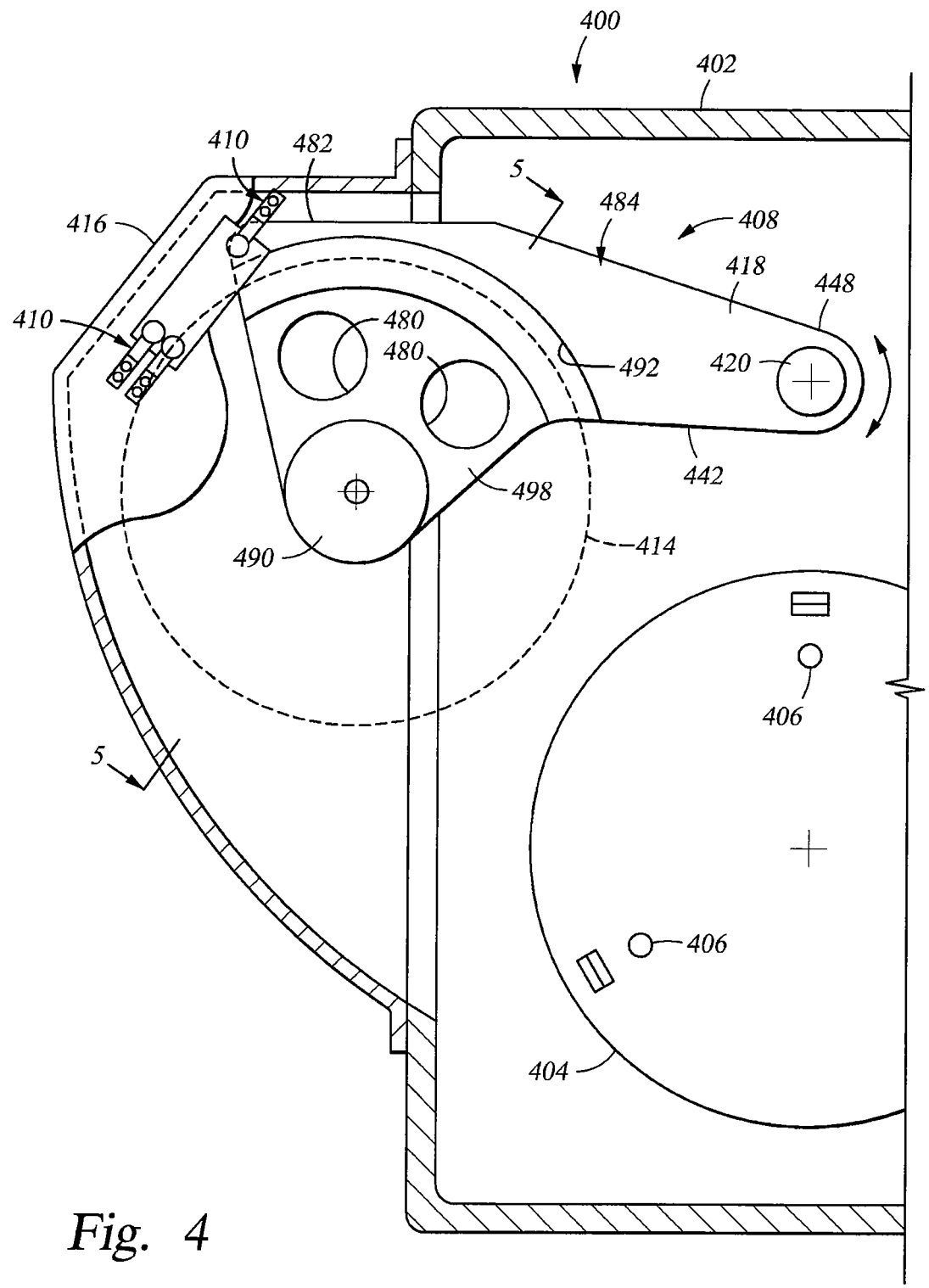
FIG. 4 depicts a partial cutaway view of another processing system having another embodiment of a shutter disk mechanism, according to an embodiment of the invention.

FIG. 4 depicts a partial cutaway view of an illustrative processing system 400 having another embodiment of a shutter disk mechanism 408 for selectively protecting a substrate support 404. The processing system 400 is generally similar to the process chamber 100 described above, and includes a chamber body 402 coupled to housing 416 that provides a storage position of a shutter disk 414 (shown in phantom in FIG. 4) when moved clear of the substrate support 404 as shown.

The shutter disk mechanism 408 is generally disposed proximate the substrate support 404 and includes a blade 418 that supports the shutter disk 414. The blade 418 may be rotated about a shaft 420 between a first clear position having the shutter disk 414 at least partially disposed in the housing 416 (as shown in FIG. 4) and a second position that facilitates transfer of the shutter disk 414 to the substrate support 404 as described above (and as shown in FIG. 6).

The blade 418 is generally fabricated from a rigid material suitable for use in a vacuum processing environment, such as a physical vapor deposition chamber. In one embodiment, the blade 418 is fabricated from titanium. In another embodiment, the blade 418 and shutter disk 414 are fabricated from materials having substantially similar or identical coefficients of thermal expansion to minimize movement therebetween.

In one embodiment, the blade 418 has a body 442 that includes a hub 448, a support pad 490 and a lip groove 492. The hub 448 is coupled to the shaft 420 to facilitate rotation of the blade 418. The body 442 of the blade 418 is configured to allow rotation of the blade 418 from the second position to the cleared position without contacting the lift pins 406 extending from the substrate support 404.

The body 442 of the blade 418 may additionally include a tab 482 that extends beyond the perimeter of the shutter disk 414. The layout of the blade 418 is such that the tab 482 may be positioned to change an output state of a sensor assembly 410 when the blade 418 is retracted into the housing 416. The sensor assembly 410 may be configured similar to the sensor assembly 110 shown in FIG. 1A. The sensor assembly 410 may also be configured to interface with the blade 418 and shutter disk 414 similar to the sensor assembly 110, blade 118 and shutter disk 114 as described above.

Figure 5:
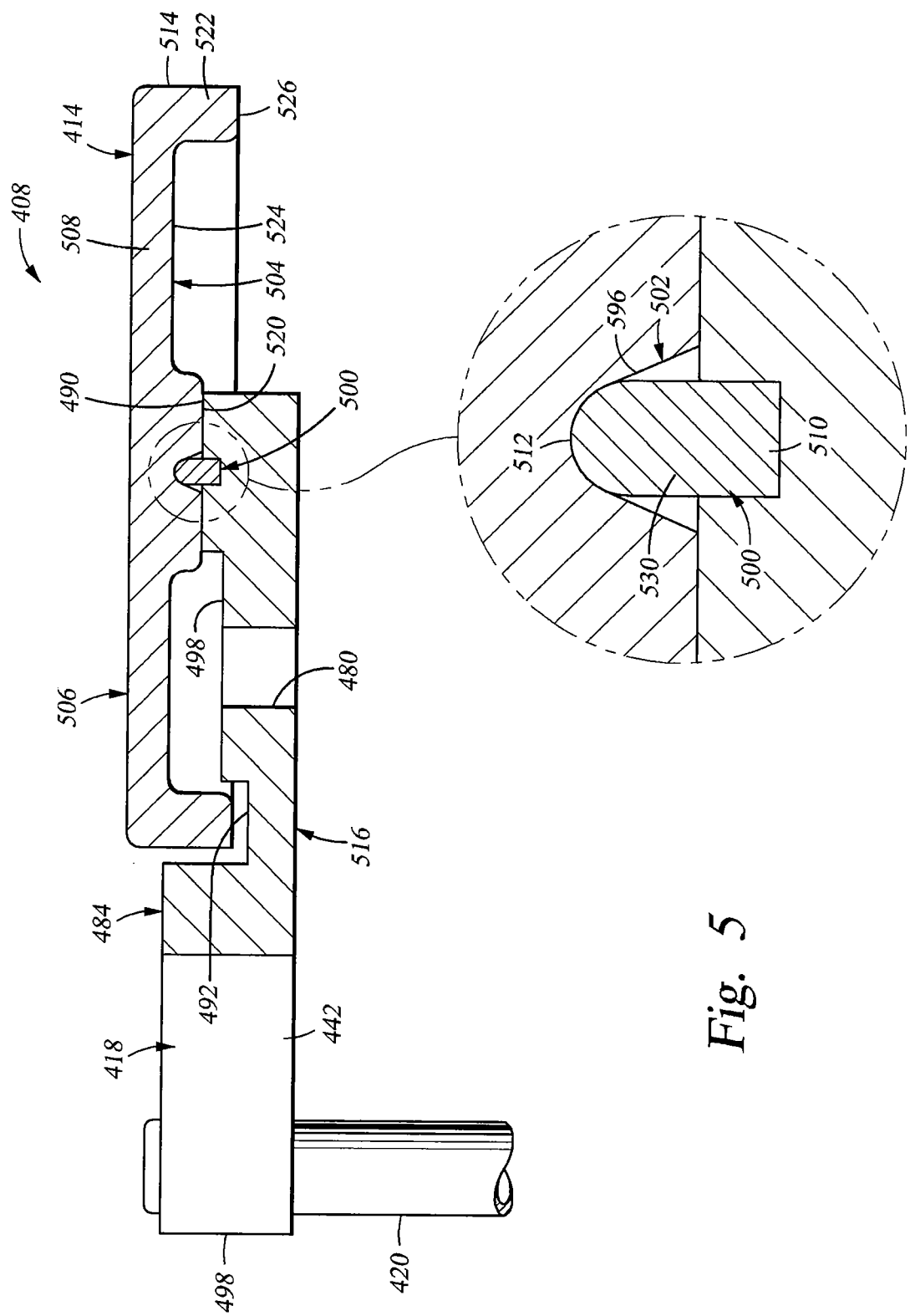
FIG. 5 depicts a sectional view of a blade and a shutter disk of the shutter disk mechanism illustrated in FIG. 4, according to an embodiment of the invention.

Referring additionally to the sectional view of the blade 418 and shutter disk 414 of FIG. 5, the support pad 490 of the blade 418 is disposed on an upper surface 484 of the blade 418. The support pad 490 is adapted to support a center pad 520 extending from a lower surface 504 of the shutter disk 414. The support pad 490 has a finish that minimizes particle generation between the blade 418 and shutter disk 414, and in one embodiment, is better than about 32 RMS.

The support pad 490 is interfaced with an alignment feature 500 configured to engage a lower surface 504 of the shutter disk 414. The alignment feature 500 retains the shutter disk 414 in a predefined orientation relative to the blade 418. The alignment feature 500 is generally centered at a radial distance from the centerline of the shaft 420 equal to the radial distance between the shaft 420 and a center of the substrate support 404. The alignment feature 500 is configured to prevent the shutter disk 414 from becoming disengaged from the blade 418 during transfer. As the alignment feature 500 is axially aligned with the center of the shutter disk 414, the need for rotational orientation between the shutter disk 414 and the blade 418 is advantageously eliminated while maintaining alignment of the shutter disk 414 and blade 418 through thermal changes without altering the ability of the blade 418 to seat the shutter disk 414 in a predefined position (e.g., coaxially) on the substrate support 404.

In one embodiment, the alignment feature 500 is a post 530 extending between the support pad 490 and lower surface 504 of the shutter disk 414. The alignment post 530 may be an integral part of the body 442 of the blade 418 or comprise a separate element. It is also contemplated that the alignment post 530 may alternatively be part of the shutter disk 414 and may interface with a hole formed in the blade 418.

In the embodiment depicted in FIG. 5, the alignment post 530 has a first end 510 that is coupled to the blade 41. The alignment post 530 may be coupled to the blade 418 through a variety of methods, including screwing, riveting, brazing, welding, press-fitting and staking among other methods. A second end 512 of the alignment post 530 is disposed opposite the first end 510 and is configured to engage a blind hole 502 formed in a lower surface 504 of the shutter disk 414.

The second end 512 of the alignment post 530 may be chamfered, rounded or tapered to facilitate alignment and engagement with the blind hole 502 of the shutter disk 414. In one embodiment, blind hole 502 may optionally include a flared sidewall 596 to further enhance entry of the post 530 into the blind hole 502

A clearance field 498 is formed in the upper surface 484 of the blade 418 and laterally separates the support pad 490 and the lip groove 492. The clearance field 498 is generally at a lower elevation relative a lower surface 516 of the blade 418 than the support pad 490 and at a higher elevation relative the lower surface 516 than the lip groove 492. The lower elevation of the clearance field 498 allows the shutter disk 414, when supported on the support pad 490, to be maintained in a spaced-apart relation with the remainder of the blade 418.

The shutter disk 414 is generally a substantially disk-shaped body 508 defined between the lower surface 504 and an upper surface 506. The disk-shaped body 508 may be fabricated from materials suitable for using in a PVD chamber, for example stainless steel or titanium, among other materials. In one embodiment, the disk-shaped body 508 is fabricated from a material having a substantially similar or identical CTE relative to a material comprising the blade 418. Optionally, holes 480 may be formed through the body 442 of the blade 418 to minimize the moment of inertia, weight and thermal inertia of the blade 418.

The lower surface 504 of the shutter disk 414 includes a center pad 520 and a downwardly extending annular lip 522. The center pad 520 is configured to interface with the alignment feature 500 of the blade 418, and in the embodiment depicted in FIG. 5, includes the blind hole 502 formed in the center pad 520 axially along a centerline of the shutter disk 414. Generally, the center pad 520 has a surface finish similar to that of the support pad 490 of the blade 418 (i.e., at least as smooth as about 32 RMS) to minimize particle generation therebetween.

The shutter disk 414 may include a recess 524 that separates the center pad 520 and the lip 522. The recess 524 allows the bulk of the shutter disk 414 to remain clear of the blade 418 while the shutter disk 414 is seated on the blade 418.

Figure 6:
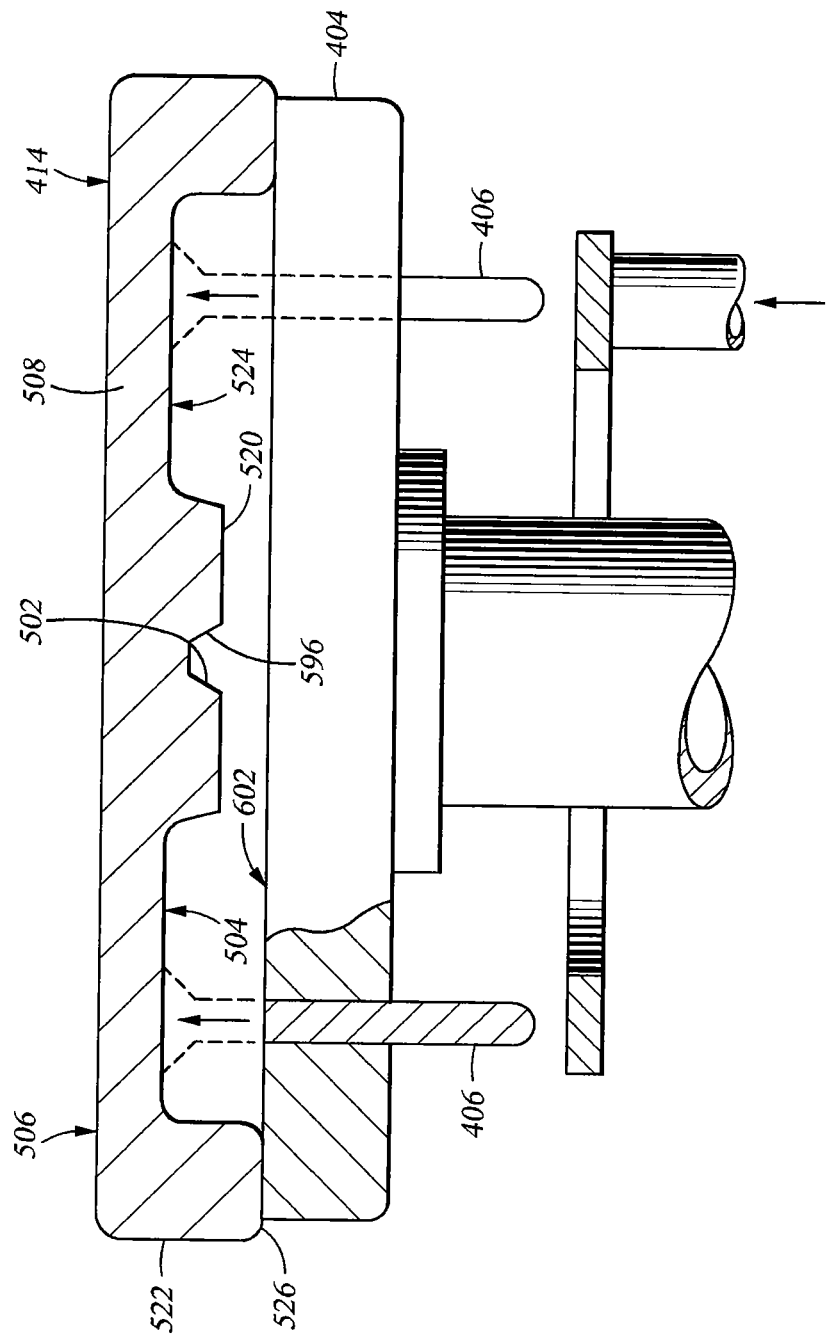
FIG. 6 depicts the shutter disk of FIG. 5 disposed on a substrate support, according to an embodiment of the invention.

Referring now to FIGS. 5 and 6, the lip 522 is positioned proximate a perimeter 514 of the shutter disk 414 and extends downward to a lip face 526. The lip face 526 is oriented on a plane parallel to a plane defined by the center pad 520 and perpendicular to the centerline of the disk-shaped body 508. The lip 522 extends from the lower surface 504 beyond the elevation of the center pad 520 and recess 524. The height of the lip 522 is selected to provide separation between the disk-shaped body 508 and substrate support 404 (as seen in FIG. 6) while remaining spaced-apart from lip groove 492 when the shutter disk 414 is carried on the blade 418.

The lip 522 is generally configured to have a diameter about equal to or greater than a diameter of an upper surface 602 of the substrate support 404. The extended lip 522 allows the shutter disk 414 to be positioned on the substrate support 404 in an orientation that prevents the upper surface 602 of the substrate support 404 from being exposed during selected conditioning processes while maintaining the center pad 520 and recess 524 in a spaced-apart relation relative to the substrate support 404. As the lip 522 is relatively narrow, the contact area between the substrate support 404 and shutter disk 414 is minimized to minimize particle generation and potential damage to the substrate support 404 during conditioning processes.

As substrate diameters become larger, the precise placement of a shutter disk, robot blade effector, and other elements in a processing chamber during conditioning becomes even more important. The misplacement of a shutter disk or robot blade effector from its prescribed location can and does create early and premature reduction in quality of the wafers being processed, and may result in damage to the surrounding chamber components. While periodic replacement of internal chamber components upon which film deposition occurs is part of a periodic preventative maintenance plan, a misaligned shutter disk or robot blade effector in the chamber can allow deposition material to build up on surfaces which should not be exposed during conditioning. The resulting deficiency will show up in subsequent quality checks of the substrates being processed. For example, the resulting deficiency can appear as scratches on the underside of a substrate upon which deposited material on the substrate support or heater has occurred, or as a result of a non-uniform buildup of deposited material on one side of the substrate. The temperature in the processing chamber can cycle rapidly and through a large temperature range. Temperature variations in the chamber can cause components of a shutter blade assembly or robot blade assembly to expand and contract. Consequently, it is necessary to avoid premature and unscheduled failures due to the inability of the shutter blade assembly or robot blade assembly to account for temperature variations as the shutter disk or robot blade end effector is being manipulated.

Figure 7:
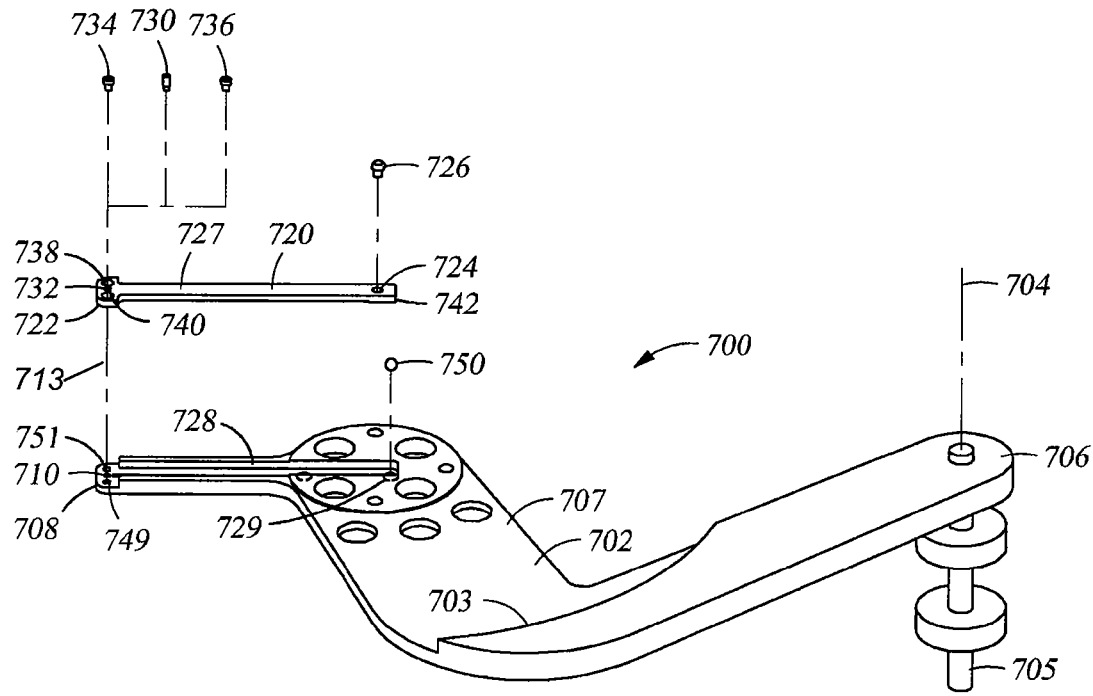
FIG. 7 depicts a perspective exploded view of a shutter blade assembly having a thermal compensating member, according to an embodiment of the invention.

FIG. 7 shows an exploded perspective view of a shutter blade assembly 700 having thermal expansion compensating features. Shutter blade assembly 700 illustrates one configuration of a processing chamber element positioning system. A positioning member 702 is coupled at an anchoring end 706 to an actuator 705. Actuator 705 is shown as a rotor, or rotary actuator, but actuator 705 may be any rotary or linear actuator capable of controlling the position of positioning member 702. Actuator 705 could extend from a fixed position in a processing chamber (not shown) along a reference axis 704 to a reference point 711 (shown in FIG. 10). In general, the actuator 705 is coupled to or mounted on a portion of the processing chamber, such as a wall or other mounting surface. The reference axis 704 extends past or through the positioning member 702 at the anchoring end 706. Reference axis 704 could be disposed along a central, edge or other portion of an actuator. The anchoring end 706 of positioning member 702 could be disposed around, proximate to, or in a position contacting the reference axis 704. The reference axis 704 could be collinear with an axis (e.g., rotary axis) of a rotary actuator (e.g., actuator 705) or a linear actuator. In one example, the rotary axis may be collinear with the axis of the rotating shaft of the rotary actuator and with the reference axis 704. The anchoring end 706 may have a mounting surface (e.g., junction where actuator 705 couples to the anchoring end 706) that can be coupled to a driven component of the actuator 705 (e.g., shaft of the rotary actuator). In one example, the mounting surface is circular and the reference axis 704 crosses through the center of the mounting surface. In another example, the mounting surface is a flat edge adapted to be coupled with a driven component also having a flat edge (See FIG. 14).

Positioning member 702 includes a positioning body 707 extending from the anchoring end 706 to a distal free end 708. A coupling point 710 is located near or at the distal free end 708. A rotatable axis 712 (shown in FIG. 10), which is perpendicular to the reference axis 704, extends from a reference point 711 disposed on the reference axis 704 to the coupling point 710. Rotatable axis 712 can be used to determine radial distances from the reference axis 704 of different features included in shutter blade assembly 700, such as a radial distance of coupling point 710 from reference axis 704. In some configurations employing a rotor as actuator 705, reference axis 704 may be described as a rotary axis. In a configuration employing a linear actuator, an axis similar to rotatable axis 712 could be used to determine distances from a reference axis in that embodiment.

Referring to FIG. 7, a thermal compensating member 720 is shown above distal free end 708. Thermal compensating member 720 could be used as a thermal compensating feature to maintain relative positions of components in shutter blade assembly 700 as the temperatures of these components vary during processing and/or idle times. As will be described in more detail below, positioning member 702 includes a positioning body 707 that is composed of a material having a first CTE that is relatively low when compared to the material composing the thermal compensating member 720, which has a second CTE greater than the first CTE. A fixed end 722 (See FIG. 7) of thermal compensating member 720 is coupled or secured to coupling point 710 of positioning member 702 at a connection point 732 of thermal compensating member 720 proximate the fixed end 722. In one configuration, an end anchor pin 730 may be tightly fitted through an anchoring pin hole at connection point 732 and into another hole at coupling point 710 to attach the thermal compensating member 720 to the positioning member 702. The connection point 732 and the coupling point 710 of the positioning member 702 may be located on a distal end line 713 that is parallel with the reference axis 704.

Thermal compensating member 720 includes a thermal compensating body 727 that extends from the fixed end 722, which is in line with rotatable axis 712 towards the reference axis 704 and actuator 705, to a movable end 742. The thermal compensating body 727 may include a material that has the second CTE. A support point hole serving as an attachment point 724 is located proximate to the movable end 742. Attachment point 724 can be used to couple an element, such as shutter disk (not shown) or robot blade end effector (not shown), to the thermal compensating member 720. For example, attachment point 724 can receive a shutter disk support fitting 726. The shutter disk support fitting 726 could be used to engage with a portion of the shutter disk (e.g., shutter disk 414) and/or secure the shutter disk to shutter blade assembly 700. Shutter blade assembly 700 could then position the shutter disk (e.g. shutter disk 414) as needed in a processing system (e.g., processing system 400).

The positioning member 702 could include a recess 703 for supporting/accommodating a shutter disk (e.g., shutter disk 414) therein/thereon.

Figure 8A:
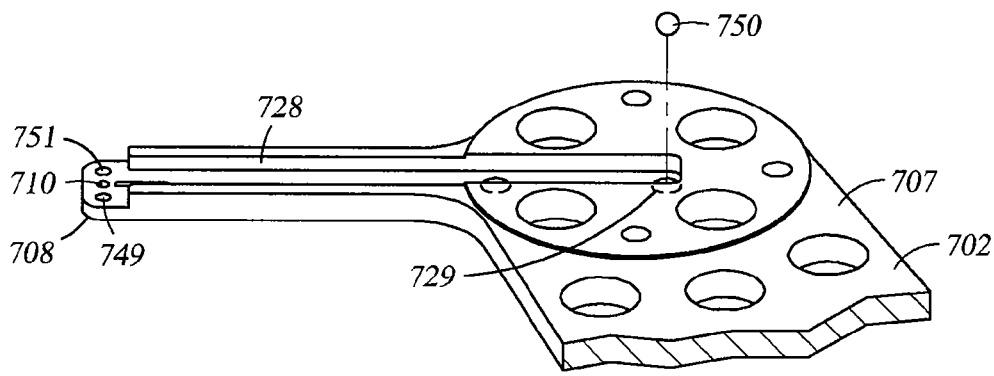
FIG. 8A depicts a close-up view of one end of a positioning member of the shutter blade assembly, according to an embodiment of the invention.
Figure 8B:
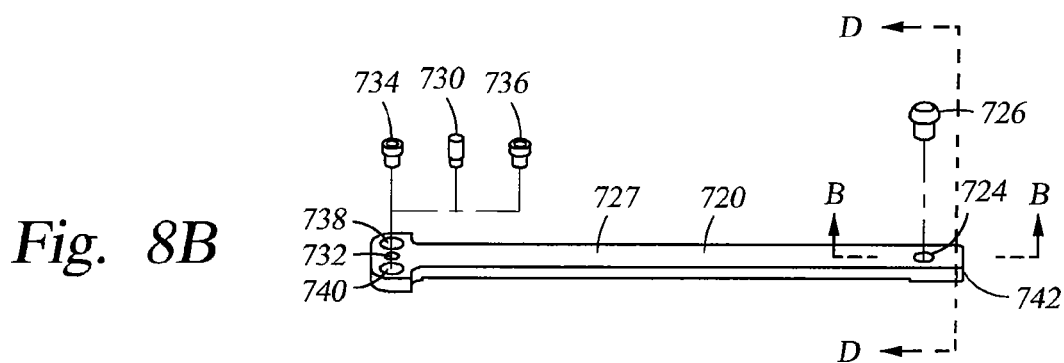
FIG. 8B depicts a close-up view of a thermal compensating member which combines with the positioning member to form a thermally compensating shutter blade assembly, according to an embodiment of the invention.

FIG. 8A shows a close-up view of the distal free end 708 of the positioning member 702. FIG. 8B shows a close-up view of the thermal compensating member 720. A slot 728 disposed in the positioning member 702 is sized to loosely receive the thermal compensating member 720 therein. Slot 728 could be a recess, groove, slot, notch or other type of depression in positioning member 702. Referring to FIGS. 7 and 8A, the thermal compensating member 720 is loosely fitted in the slot 728 and fixed at the coupling point 710 to enable the thermal compensating member 720 to expand from the coupling point 710 towards the reference axis 704.

An end anchor pin 730 may be tightly fitted within an anchoring pin hole at the connection point 732 and into another hole at coupling point 710 to attach the thermal compensating member 720 to the positioning member 702. Fasteners 734, 736 extend through recessed holes 738, 740 into threaded receiving holes 751, 749 in the distal free end 708 of the positioning member 702. The bottom surface of the thermal compensating member 720 maybe recessed to reduce the amount of friction between the bottom of the thermal compensating member 720 and the surface upon which it rests in the slot 728 of the positioning member 702.

Figure 9A:
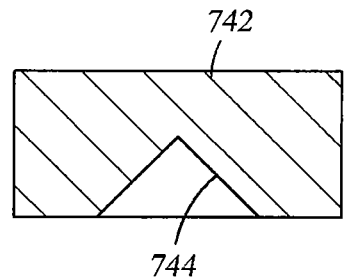
FIGS. 9A-9D depict end, cross-sectional, and combination cross sectional views showing the joint, spanned by a rollable ball, between a positioning member and a thermal compensating member of the shutter blade assembly, according to one or more embodiments of the invention.

FIG. 9A is an end view of the movable end 742 of the thermal compensating member 720 showing a "V" groove 744 on a surface of thermal compensating body 727 facing the positioning body 707 (See FIG. 7 for 720, 727 and 707).

Figure 9B:
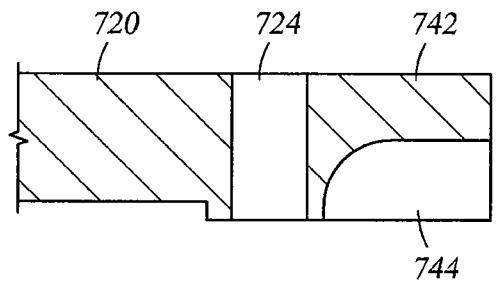

FIG. 9B is a cross-sectional view of the movable end 742 of the thermal compensating member 720 along line B-B of FIG. 8B showing the attachment point 724 and the downward facing "V" groove 744 at the end of the thermal compensating member 720.

Figure 9C:
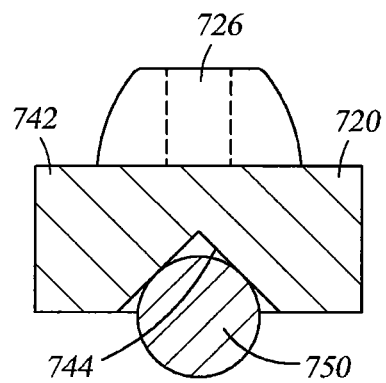

FIG. 9C is sectional view along line D-D of FIG. 8B showing the thermal compensating member 720 near the movable end 742 with a friction reducing and particle generation reducing ball 750 partially housed within the "V" groove 744. Shutter disk support fitting 726 is shown extending above the upper surface of the thermal compensating member 720.

Figure 9D:
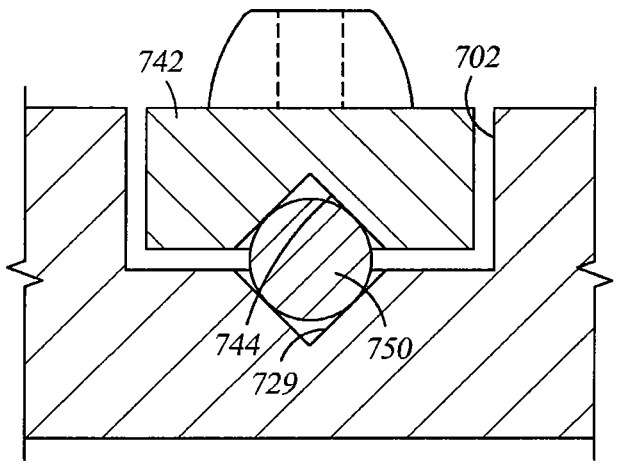

FIG. 9D is a sectional view showing a "V" groove 729 on a surface of positioning body 707 facing "V" groove 744 on the thermal compensating body 727 (See FIG. 7 for 707 and 727). Referring to FIGS. 7 and 9D, the friction reducing and particle generation reducing ball 750 is shown disposed between the "V" grooves 729, 744. The "V" grooves could be linear with a central axis passing through or parallel to rotatable axis 712 (See FIG. 10 for 712). In this embodiment, the thermal compensating body 727 faces the positioning body 707 and the friction reducing and particle generation reducing ball 750 is disposed between the positioning body 707 and the thermal compensating body 727. The friction reducing and particle generation reducing ball 750 preferably has a proximal diameter which is greater than the depth of the "V" groove 744 ensuring that the surfaces of the positioning body 707 and the thermal compensating body 727 proximate the friction reducing and particle generation reducing ball 750 do not contact each other. The weight and contact force generated by the clamping of the fasteners 734, 736, which joins the thermal compensating member 720 with the positioning member 702, retains the friction reducing and particle generation reducing ball 750 in the "V" grooves 729, 744 facing each other between the positioning member 702 and the thermal compensating member 720.

Figure 10:
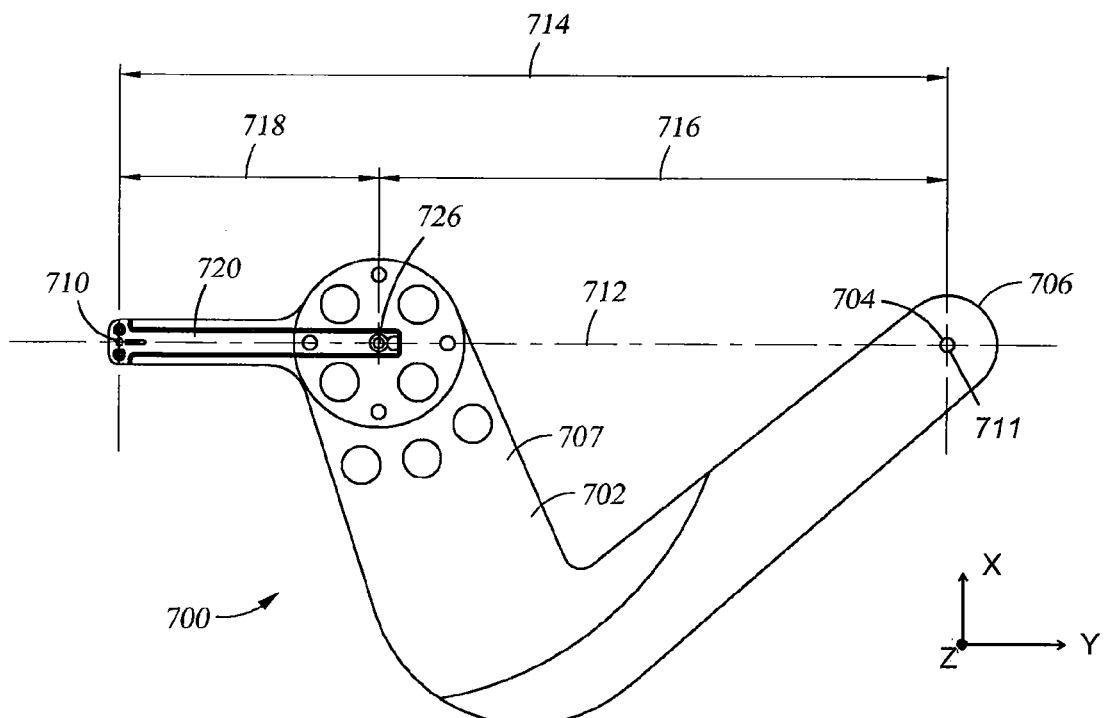
FIG. 10 depicts a top view of the shutter blade assembly, according to an embodiment of the invention.

FIG. 10 is a plan view of the shutter blade assembly 700 showing the rotatable axis 712 perpendicular to reference axis 704. Referring to FIG. 7 and FIG. 10, the positioning body 707 extends a first distance 714 from a reference point 711 on reference axis 704 to coupling point 710 proximate the distal free end 708 of the positioning member 702. Attachment point 724 (i.e., right below fitting 726 shown in FIG. 10) is a controlled point in shutter blade assembly 700 because thermal compensating member 720 can be used to control the position of the attachment point 724. The controlled point (e.g., attachment point 724) is proximate movable end 742 of thermal compensating member 720 and is separated from reference axis 704 by a second distance 716 that is less than first distance 714. The controlled point can coincide with an attachment point, as shown in shutter blade assembly 700, or the controlled point can be separated from an attachment point, as described below when a robot blade assembly 1600 is discussed. The second distance 716 defines an attachment distance between the reference axis 704 and an attachment point (e.g., attachment point 724) for coupling an element to the thermal compensating member 720. A third distance 718 could be defined by the difference between the first distance 714 and the second distance 716. The third distance 718 is equivalent to the distance between the connection point 732 and the controlled point (e.g., the attachment point 724).

Referring to FIGS. 7 and 10, a processing chamber element positioning system, such as shutter blade assembly 700, can maintain a position of a controlled point, such as attachment point 724, relative to another point or axis, such as reference axis 704. The coefficients of thermal expansion and relative dimensions along rotatable axis 712 of the positioning member 702 and the thermal compensating member 720 can be designed to cause the position of the attachment point 724 to have a constant dimensional separation from reference axis 704 as temperature surrounding the shutter blade assembly 700 changes. To accomplish this constant dimensional separation, a distance ratio of the first distance 714 to the third distance 718 could be designed to be substantially equal to a CTE ratio of the second CTE (i.e., CTE of thermal compensating member 720) to the first CTE (i.e., CTE of positioning member 702). Thus, a rising temperature could cause the distal free end 708 positioning member 702 to expand away from reference axis 704, and simultaneously cause movable end 742 of thermal compensating member 720 to expand back towards reference axis 704 resulting in no overall change in a position of a controlled point on thermal compensating member 720, such as attachment point 724.

In one example, the positioning member 702 can be made of titanium having a CTE in the range of 8 to 9 μm per degree Kelvin, while the thermal compensating member 720 can be made of aluminum having a CTE the range of 24 to 27 μm per degree Kelvin. The ratio between the CTE of the positioning member 702 to the CTE of the thermal compensating member 720 can be designed to have a ratio of 1:3. Since the temperature rise of the shutter blade assembly 700 is likely to be relatively uniform, when the dimensions along the rotatable axis 712 for the positioning member 702 and the thermal compensating member 720 have a ratio of 3:1 (exactly opposite the ratio of the coefficients of thermal expansion), then the position of the attachment point 724 will remain constant along the rotatable axis 712 as the temperature changes.

In some embodiments, the dimensions and coefficients of thermal expansion of positioning member 702 and thermal compensation member 720 can be designed with sufficient precision to maintain a position of a controlled point on thermal compensating member 720, such as attachment point 724, within a threshold of 0.002 inches throughout temperature changes exceeding 200 degrees F. In some embodiments, the precision of the design can decrease the threshold to 0.001 inches throughout temperature changes exceeding 200 degrees F.

In embodiments employing a rotary actuator, such as shown in FIG. 7, the first distance, second distance, and third distance 714, 716, 718 could be described as a first radial distance, second radial distance, and a third radial distance. The first radial distance defined by the distance between the rotary axis (e.g., reference axis 704) and the coupling point 710. The second radial distance defined by the distance between the rotary axis and the attachment point. The third radial distance defined by the difference between the first radial distance and the second radial distance. To maintain a position of a controlled point, such as attachment point 724, a distance ratio of the first radial distance to the third radial distance could be set substantially equal to a CTE ratio of the second CTE (i.e., CTE of thermal compensating member 720) to the first CTE (i.e., CTE of positioning member 702).

Figure 11:
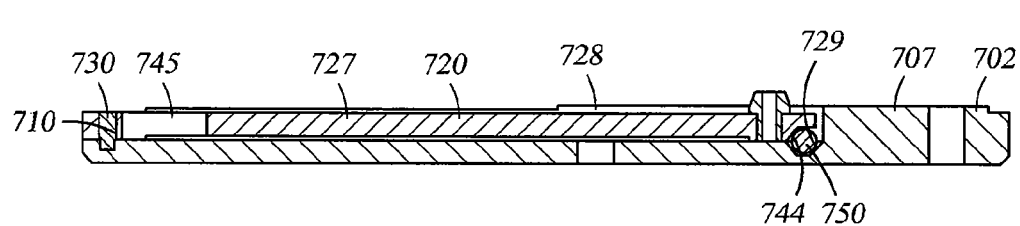
FIG. 11 depicts a cross-sectional view of an end portion of the shutter blade assembly illustrated in FIG. 10, according to an embodiment of the invention.

FIG. 11 is a cross sectional view of the shutter blade assembly 700 showing the thermal compensating member 720 positioned in the slot 728 on the positioning member 702. Referring to FIGS. 7, 10, and 11, the thermal compensating member 720 is fixed at the coupling point 710 and floating on the friction reducing and particle generation reducing ball 750 disposed in grooves 729, 744 near the movable end 742. The friction reducing and particle generation reducing ball 750 could be disposed at a radial position between the attachment point 724 and the movable end 742.

Figure 12:
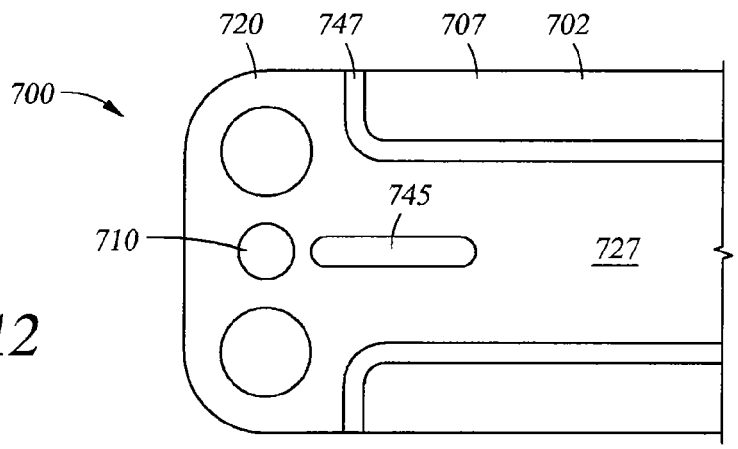
FIG. 12 depicts a close-up top view of the end connection between the positioning member and the thermal compensating member of the shutter blade assembly, according to an embodiment of the invention.

FIG. 12 is a plan view of the distal end of the shutter blade assembly 700. Spacing 747 is shown between the positioning member 702 and the thermal compensating member 720 to facilitate any differences in thermal expansion between the two members. Also shown is a radial blade homing slot 745 provided at the end nearest the coupling point 710. The radial blade homing slot 745 is useful for homing the shutter blade assembly 700 using optical devices to calibrate the positioning of the blade with the system.

Figure 13:
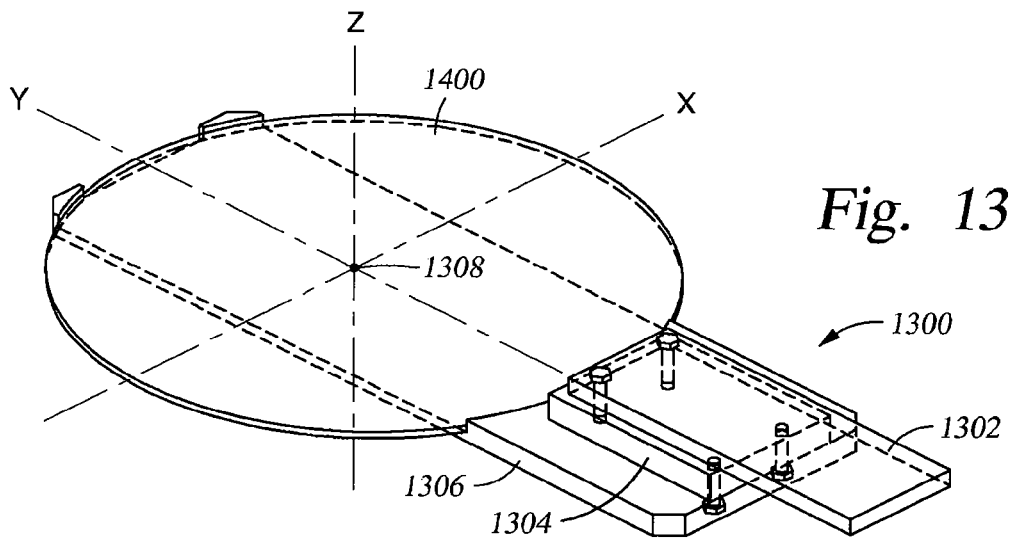
FIG. 13 shows a perspective view of a robot blade assembly with a thermal compensating member, according to an embodiment of the invention.
Figure 14:
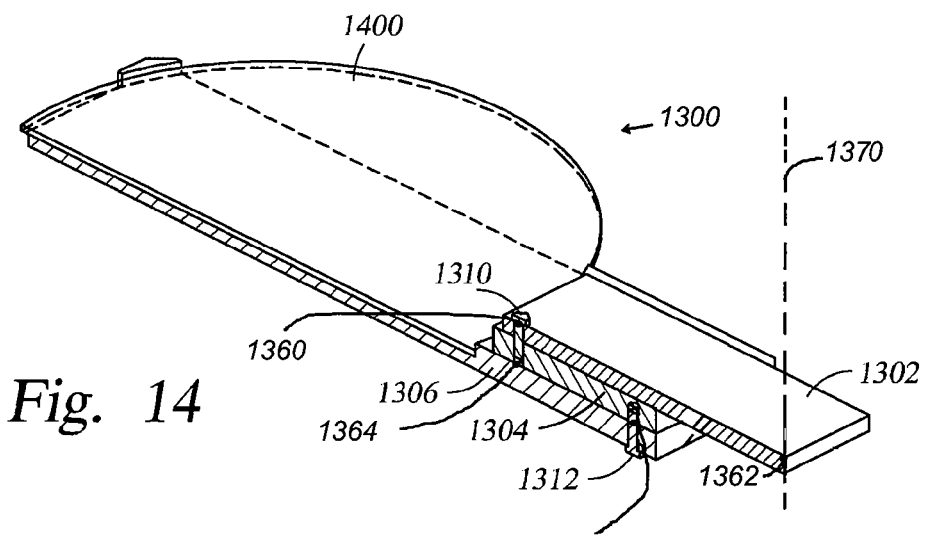
FIG. 14 shows a cross-sectional view of the robot blade assembly illustrated in FIG. 13, according to an embodiment of the invention.

FIGS. 13 and 14 depict a robot blade assembly 1300 having thermal expansion compensating features. Robot blade assembly 1300 is another embodiment of a processing chamber element positioning system and can be used for carrying substrates or wafers into and out of processing chambers. Robot blade assembly 1300 can be described similarly to shutter blade assembly 700 in that both have a positioning member (e.g., positioning member 702, 1302), a thermal compensating member (e.g., thermal compensating member 720, 1304), a reference axis and the same four assembly points (i.e., a reference point, a coupling point, a connection point, and an attachment point) that allow for a design that causes the thermal compensating member to maintain the position of a shutter disk or a robot blade end effector as temperature changes.

A positioning member 1302, which is shown as a robot blade arm, extends from a reference point 1362 on a reference axis 1370 to a coupling point 1360. An actuator in a processing chamber (not shown) could extend along reference axis 1370 from a fixed position in the processing chamber to reference point 1362. The positioning member 1302 may have an anchoring end that is coupled to the actuator (not shown) and contacting reference point 1362. The anchoring end may be used to couple the robot blade assembly 1300 to a robotic actuator or device, such as a SCARA robot or other similar robotic device.

A fastener 1310 may be used to join coupling point 1360 of positioning member 1302 to a connection point 1364 of thermal compensating member 1304. The thermal compensating member 1304 may extend back towards reference axis 1370 to a position where a second fastener 1312 clamps thermal compensating member 1304 to an arm end of a robot blade end effector 1306 at an attachment point 1366. Although fasteners, such as screws are shown in FIGS. 13 and 14, any fastening or clamping mechanism could be used.

The robot blade end effector 1306 could include a substrate support recess in which substrates are carried. The substrate support recess includes a center point 1308, which references the center position of the substrate, and the recess in which a substrate 1400 is transferred.

Because the same four critical points are defined, the position of the attachment point 1366 can be maintained in robot blade assembly 1300 similarly to how the position of attachment point 724 was maintained in shutter blade assembly 700. A constant dimensional separation between the attachment point 1366 and the reference axis 1370 can be maintained. To accomplish this constant dimensional separation, a distance ratio of the distance between the reference point 1362 and the coupling point 1360 on positioning member 1302 to the distance between the connection point 1364 and the attachment point 1366 on thermal compensating member 1304 can be designed to be substantially equal to a CTE ratio of the CTE of thermal compensating member 1304 to the CTE of positioning member 1302.

Thus, a rising temperature could cause the positioning member 1302 to expand away from the reference point 1362 and towards center point 1308, and simultaneously cause thermal compensating member 1304 to expand back in the opposite direction towards reference axis 1370 resulting in no overall change in a position of a controlled point on thermal compensating member 1304, such as its attachment point 1366.

Because robot blade end effector 1306 is constructed of a material having a low CTE, a design that maintains the position of the attachment point 1366 also maintains the position of the critical parts of robot blade end effector 1306, such as center point 1308.

Figure 15:
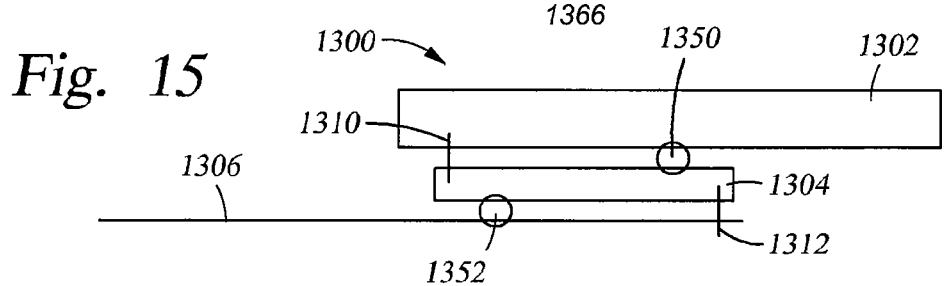
FIG. 15 shows a schematic side view of the robot blade assembly illustrated in FIG. 13, according to an embodiment of the invention.

FIG. 15 is a schematic side sectional view of the robot blade assembly 1300 of FIGS. 13 and 14 showing the position of particle reducing rolling balls 1350, 1352 which are positioned between the positioning member 1302 and the thermal compensating member 1304 and between the thermal compensating member 1304 and the robot blade end effector 1306. In this configuration, the thermal compensating member 1304 may have a different CTE relative to the CTE of the positioning member 1302. While "V" grooves are not shown, "V" grooves would be provided with the particle reducing rolling balls 1350, 1352 disposed therein to provide alignment of the respective differential expanding components as was described above for the shutter blade assembly 700.

Figure 16A:
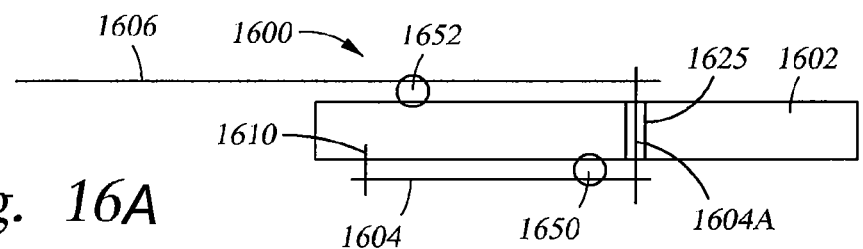
FIG. 16A shows a schematic side view of an alternate embodiment of a robot blade assembly, according to an embodiment of the invention.

FIG. 16A shows an embodiment of a robot blade assembly 1600, which reduces the likelihood of dropping a robot blade end effector during its installation onto a robot assembly (not shown). A positioning member 1602 extends to fastener 1610 providing a clamping and anchoring point between the positioning member 1602 and the thermal compensating member 1604. In this configuration, the thermal compensating member 1604 has an "L" shaped configuration with a lateral arm 1604A extending through a slot 1625 of the positioning member 1602 and is fixed to a robot blade arm end of a robot blade end effector 1606. In this configuration, particle reducing rolling balls 1650, 1652 positioned within "V" grooves (not shown) are wedged more tightly into position by the weight and geometric configuration of the pieces as assembled. The particle reducing rolling balls 1650, 1652 can be made of stainless steel or ceramic, so long as they do not contribute to the generation of particles within the processing chamber.

Figure 16B:
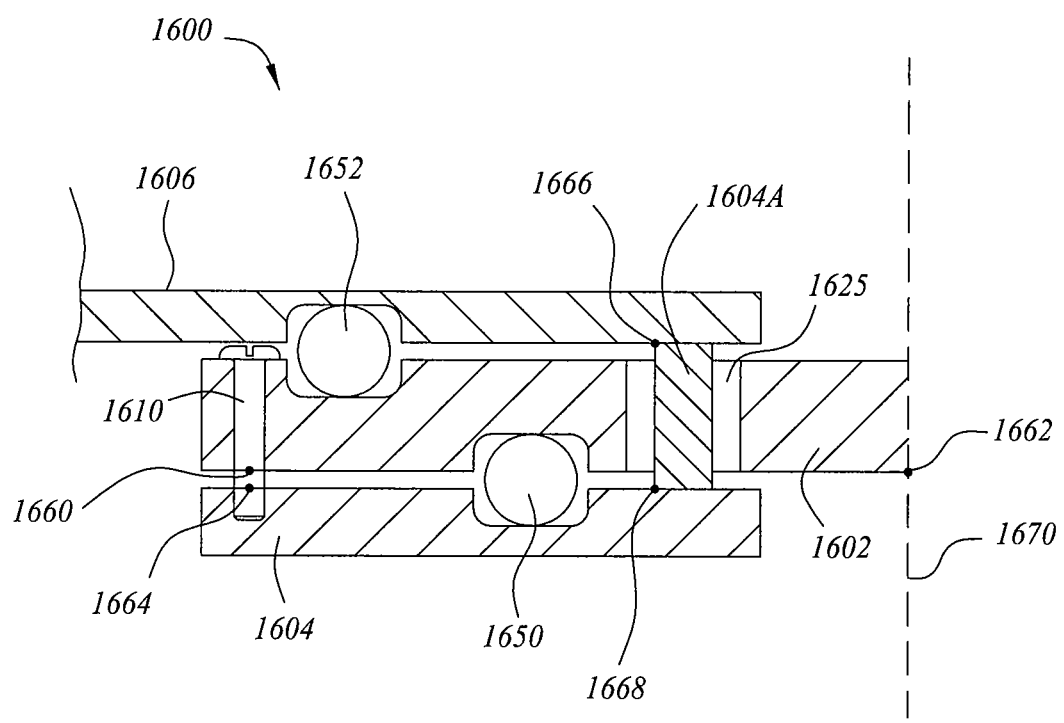
FIG. 16B shows a cross sectional view of the robot blade assembly illustrated in FIG. 16A, according to an embodiment of the invention.

FIG. 16B illustrates a cross sectional view of the embodiment illustrated in FIG. 16A. The positioning member 1602, which is shown as a robot blade arm, extends from a reference point 1662 on a reference axis 1670 to a coupling point shown 1660. The fastener 1610 could join coupling point 1660 of positioning member 1602 to a connection point 1664 of thermal compensating member 1604. The thermal compensating member 1604 extends back towards reference axis 1670. An attachment point 1666 could be defined as the location where the robot blade end effector 1606 intersects the lateral arm 1604A. To maintain the position of attachment point 1666, which has a different horizontal and vertical location different than the connection point, a fifth point, a controlled point 1668, could be defined.

In this embodiment, a fifth point, a controlled point 1668, could be defined to enable control of the position of an attachment point 1666 using a distance ratio and CTE ratio as discussed above. The controlled point 1668 is where the thermal compensating member 1604 intersects with its lateral arm 1604A. The reference point 1662 would be closer to the controlled point 1668 than to the coupling point 1660. Particle reducing rolling ball 1650 could be placed proximate the controlled point, so that the position of the controlled point can be maintained without overcoming significant amounts of friction.

Because lateral arm 1604A could be constructed of a low CTE material, maintaining the position of the controlled point 1668 could maintain position of the attachment point 1666. A constant dimensional separation between the controlled point 1668 and a reference point 1662 can be maintained. To accomplish this constant dimensional separation, a distance ratio of the distance between the reference point 1662 and the coupling point 1660 on positioning member 1602 to the distance between the connection point 1664 and the controlled point 1668 on thermal compensating member 1604 can be designed to be substantially equal to a CTE ratio of the CTE of thermal compensating member 1604 to the CTE of positioning member 1602. Similar to the other examples described above the, distance between the connection point 1664 and the controlled point 1668 on thermal compensating member 1604 could be less than the distance between the reference point 1662 and the coupling point 1660 on positioning member 1602. Also similar to the examples described above, the CTE of thermal compensating member 1604 could be greater than the CTE of positioning member 1602.

Thus, a rising temperature could cause positioning member 1602 to expand in one direction and simultaneously cause thermal compensating member 1604 to expand back in the opposite direction resulting in no overall change in a position of a controlled point 1668 on thermal compensating member 1604 and an attachment point 1666 on lateral arm 1604A.

Because robot blade end effector 1606 is constructed of a material having a low CTE, a design that maintains the position of the attachment point 1666 also maintains the position of the critical parts of robot blade end effector 1606.

In embodiments, such as shutter blade assembly 700 shown in FIG. 7, where the attachment point 724 only differs from the connection point 732 by one dimension, the attachment point is the same as the controlled point. In shutter blade assembly 700, the reference point (i.e., intersection of reference axis 704 and rotatable axis 712), the coupling point 710, the connection point 732, and the attachment point 724 could all be coplanar. Referring to FIG. 10, a Y-Z plane through the rotary axis could encompass all of these points. In embodiments, where the attachment point is separate from the controlled point (e.g., robot blade assembly 1600), all five points could be coplanar. Making these four or five points coplanar can simplify the design, but is not required and different configurations could still allow for a position of a controlled point or an attachment point to be maintained.

While the foregoing is directed to particular embodiments, other and further embodiments may be devised without departing from the basic scope thereof, and the scope thereof is determined by the claims that follow.

What is claimed is:

1. A processing chamber element positioning system, comprising:
   a positioning member comprising a positioning body that has a first CTE, wherein the positioning body further comprises:
      an anchoring end that is configured to be coupled to an actuator, wherein a reference axis extends through the anchoring end; and
      a distal free end having a coupling point that is separated from the reference axis by a first distance; and
   a thermal compensating member comprising a thermal compensating body that has a second CTE greater than the first CTE, and the thermal compensating body comprises:
      a connection point that is coupled to the positioning member body at the coupling point; and
      a controlled point separated from the reference axis by a second distance that is less than the first distance, the second distance defining an attachment distance between the reference axis and an attachment point for coupling an element to the thermal compensating member,
   wherein a third distance is equal to the first distance minus the second distance, and a distance ratio of the first distance to the third distance is substantially equal to a CTE ratio of the second CTE to the first CTE.

2. The processing chamber element positioning system of claim 1, wherein the reference axis is closer to the controlled point than to the connection point.

3. The processing chamber element positioning system of claim 2, wherein the controlled point is an attachment point that is used to couple an element to the thermal compensating member.

4. The processing chamber element positioning system of claim 3, further comprising an element coupled to the attachment point, wherein the element is a shutter disk.

5. The processing chamber element positioning system of claim 1, further comprising an element coupled to the thermal compensating member at the controlled point, wherein the element is a robot blade end effector.

6. The processing chamber element positioning system of claim 1, wherein the coupling point, the connection point and the controlled point are coplanar.

7. The processing chamber element positioning system of claim 1, wherein the thermal compensating member further comprises a lateral arm extending from the controlled point and is disposed through an opening formed in the positioning member, wherein a shutter disk or robot blade end effector is coupled to the lateral arm.

8. A processing chamber element positioning system, comprising:
   an actuator coupled to a portion of a processing chamber;
   a positioning member comprising a positioning body that has a first CTE, wherein the positioning body further comprises:
      an anchoring end that is coupled to the actuator, wherein a reference axis extends through the anchoring end and the actuator; and
      a distal free end having a coupling point that is separated from the reference axis by a first distance; and
   a thermal compensating member comprising a thermal compensating body that has a second CTE greater than the first CTE, and the thermal compensating body comprises:
      a connection point that is coupled to the positioning member body at the coupling point, wherein the thermal compensating body extends from the connection point, towards the reference axis, to a movable end; and
      an attachment point separated from the reference axis by a second distance that is less than the first distance,
   wherein a third distance is defined by a difference between the first distance and the second distance, and a distance ratio of the first distance to the third distance is substantially equal to a CTE ratio of the second CTE to the first CTE.

9. The processing chamber element positioning system of claim 8, wherein the actuator comprises a rotary actuator that has a rotation axis that is collinear with the reference axis.

10. The processing chamber element positioning system of claim 8, further comprising an element coupled to the thermal compensating member at the attachment point.

11. The processing chamber element positioning system of claim 10, wherein the element is a shutter disk.

12. The processing chamber element positioning system of claim 10, wherein the element is a robot blade end effector.

13. A processing chamber element positioning system, comprising:
   a positioning member comprising a positioning body that has a first CTE, wherein the positioning body further comprises:
      a distal free end; and
      an anchoring end that is coupled to a rotary actuator, which has a rotary axis extending through the rotary actuator, wherein the positioning body extends a first radial distance from the rotary axis to a coupling point; and
   a thermal compensating member comprising a thermal compensating body that has a second CTE greater than the first CTE, and the thermal compensating body comprises:
      a fixed end that is coupled to the positioning member at the coupling point; and
      a movable end having an attachment point that is positioned closer to the movable end than to the fixed end and is separated from the rotary axis by a second radial distance, which is less than the first radial distance,
   wherein a third distance is defined by a difference between the first distance and the second distance, and a distance ratio of the first distance to the third distance is substantially equal to a CTE ratio of the second CTE to the first CTE.

14. The processing chamber element positioning system of claim 13, further comprising an alignment ball that is disposed between the positioning body and the thermal compensating body.

15. The processing chamber element positioning system of claim 13, wherein the coupling point and the attachment point are coplanar.

16. The processing chamber element positioning system of claim 13, further comprising an element coupled to the thermal compensating member at the attachment point.

17. The processing chamber element positioning system of claim 16, wherein the element is a shutter disk.

18. The processing chamber element positioning system of claim 16, wherein the element is a robot blade end effector.

19. The processing chamber element positioning system of claim 13, wherein the thermal compensating member further comprises a lateral arm disposed through the positioning member, and the attachment point is disposed on the lateral arm.

20. The processing chamber element positioning system of claim 19, further comprising a robot blade end effector coupled to the thermal compensating member at the attachment point.

* * * * *